United States Patent [19]
Omid-Zohoor

[11] Patent Number: 5,861,104
[45] Date of Patent: Jan. 19, 1999

[54] TRENCH ISOLATION WITH ROUNDED TOP AND BOTTOM CORNERS AND EDGES

[75] Inventor: Farrokh Omid-Zohoor, Sunnyvale, Calif.

[73] Assignee: Advanced Micro Devices, Sunnyvale, Calif.

[21] Appl. No.: 623,637

[22] Filed: Mar. 28, 1996

[51] Int. Cl.$^6$ ....................................................... B44C 1/22
[52] U.S. Cl. .................................................................. 216/84
[58] Field of Search ...................................... 438/438, 427, 438/426; 216/84; 148/DIG. 50; 257/301, 510, 513

[56] References Cited

U.S. PATENT DOCUMENTS

| | | |
|---|---|---|
| 4,905,065 | 2/1990 | Selcuk et al. . |
| 5,084,408 | 1/1992 | Baba et al. ................................ 437/62 |
| 5,296,392 | 3/1994 | Grula et al. ................................ 437/34 |
| 5,387,540 | 2/1995 | Poon et al. ................................ 437/67 |
| 5,401,998 | 3/1995 | Chiu et al. ............................. 257/368 |
| 5,445,989 | 8/1995 | Lur et al. . |
| 5,445,990 | 8/1995 | Yook et al. . |
| 5,457,339 | 10/1995 | Komori et al. . |
| 5,459,096 | 10/1995 | Venkatesan et al. . |
| 5,460,998 | 10/1995 | Liu . |
| 5,466,623 | 11/1995 | Shimize et al. . |
| 5,468,675 | 11/1995 | Kaigawa . |
| 5,468,676 | 11/1995 | Madan . |
| 5,470,783 | 11/1995 | Chiu et al. . |
| 5,472,904 | 12/1995 | Figura et al. . |
| 5,472,905 | 12/1995 | Paek et al. . |
| 5,472,906 | 12/1995 | Shimize et al. . |
| 5,473,186 | 12/1995 | Morita . |
| 5,474,953 | 12/1995 | Shimizu et al. . |

OTHER PUBLICATIONS

Fuse, Genshu; Fukumoto, Masanori; Shinohara, Akihira; Odanaka, Shinji; Sasago, Masaru and Ohzone, Takashi, "A New Isolation Method with Boron–Implanted Sidewalls for Controlling Narrow–Width Effect" IEEE Transactions On Electron Devices, vol. ED–34, No. 2, Feb., 1987.

Sawada, Shizuo; Higuchi, Takayoshi; Mizuno, Tomohisa; Shinozaki, Satoshi and Ozawa, Osamu, "Electrical Properties for MOS LSI's Fabricated Using Stacked Oxide SWAMI Technology" IEEE Transactions on Electron Devices, vol. ED–32, No. 11, Nov. 1985.

*Primary Examiner*—Marian C. Knode
*Assistant Examiner*—Brenda G. Brumback
*Attorney, Agent, or Firm*—Foley & Lardner

[57] ABSTRACT

An integrated circuit device includes a substrate having a planar surface and isolating trenches etched from the substrate. The isolating trenches form corners with the surface of the substrate. The corners are shaped as slanted regions, having a 111-crystal plane structure. When a gate oxide layer is grown over the substrate, the trench corners will have a gate oxide layer of a greater thickness than the rest of the trench, thereby reducing parasitic transistors.

8 Claims, 7 Drawing Sheets

TRENCH ISOLATION WITH ROUNDED TOP AND BOTTOM CORNERS AND EDGES

BACKGROUND OF THE INVENTION

1. Field of the Invention

The invention relates generally to an apparatus for and method of suppressing formation of parasitic edge transistors near a field effect transistor being formed on a semiconductor substrate. More particularly, the invention relates to an apparatus and method of obtaining rounded top and bottom corners of a trench used to form the field effect transistor in order to reduce parasitic edge transistors near the field effect transistor.

2. Description of the Related Art

Various methods have been developed to isolate devices within integrated circuits. One of the methods is known as trench etch and refill. In this method, a trench is etched into a substrate and is filled with a chemical vapor deposition (CVD) oxide. The etched trench may be shallow (depth<1 $\mu$m), of moderate depth (1 $\mu$m≦depth≦3 $\mu$m), or deep and narrow (depth>3 $\mu$m and width<2 $\mu$m). Deep and narrow trenches refilled with CVD oxide are particularly useful for preventing latchup and for isolating n-channel from p-channel devices in CMOS circuits.

Fabrication of trenches, however produces parasitic edge transistors at the corners and edges of the trench sidewalls. Parasitic edge transistors are not desired because they increase the OFF current of the devices of the integrated circuit and increase the susceptibility to latchup. Parasitic edge transistors also turn on at a lower voltage than the active device, thereby causing a phenomenon known as a "subthreshold kink" in the drain current versus gate voltage ($I_D$-$V_G$) characteristic curve.

Figure 1:
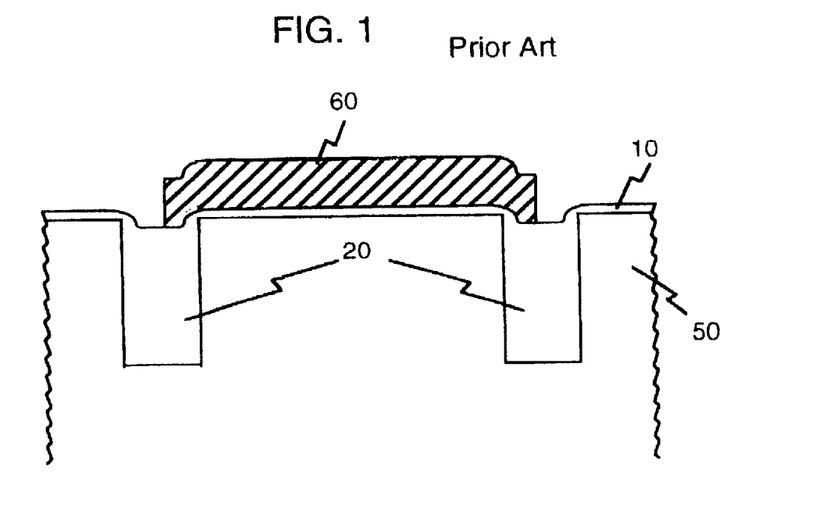
FIG. 1 shows a cross-section of a conventional integrated circuit device utilizing deep and narrow trench isolation.

FIG. 1 shows a conventional deep-and-narrow isolation trench structure. A silicon substrate 50 is formed with trenches 20. Trenches 20 are filled with an oxide to isolate active devices from each other. A gate oxide 10 covers the substrate 50 and the oxide in the trenches 20. A gate polysilicon (poly) electrode 60 is on top of the gate oxide 10 and positioned over the substrate 50 to form an active device with the ends of the gate poly electrode 60 extending over a portion of the trenches 20.

The oxide 10 is formed with dimples in the trenches 20. The dimples are caused by overetching of a sacrificial oxide (sacox) prior to forming the gate oxide 10. When the gate oxide 10 and the gate poly electrode 60 are added, the poly recesses partially into the trenches 20.

The conventional structure, as shown in FIG. 1, forms parasitic edge transistors at the corners and edges of the trenches 20. The recessed portion of the gate poly electrode 60 acts as a gate electrode of the parasitic transistor and the portion of the gate oxide between the recessed portion and the side wall of the trench 20 acts as a gate oxide of the parasitic transistor.

Further problems occur due to a thinning of the gate oxide 10 at the corners and edges of the trenches 20 where the gate oxide 10 recesses into the trenches 20. Thinned gate oxide decreases reliability and increases the electric field strength at the trench corner and edge, thereby exacerbating the above discussed problem regarding parasitic transistors.

Another possible solution to reducing parasitic edge transistors is to dope the corner and edge regions of the trench sidewalls. By introducing dopants into the trench sidewalls, the parasitic edge transistors are shut off and the subthreshold kink in the Id versus Vg characteristic curve is suppressed to some extent.

Figure 2A:
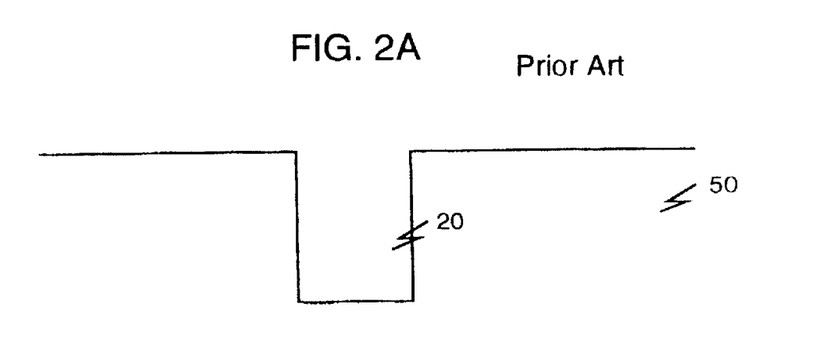
FIGS. 2A–2C show a conventional method of implanting ions into sidewalls of isolation trenches.
Figure 2B:
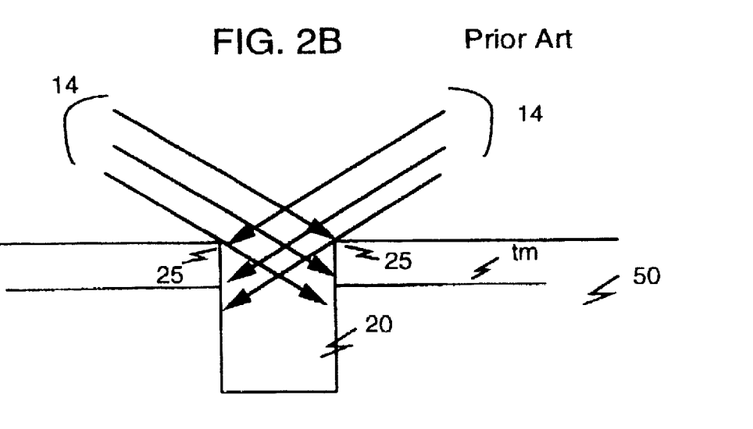
Figure 2C:
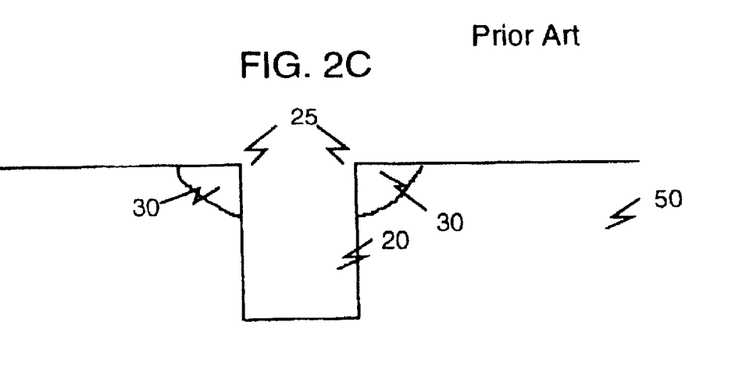

FIGS. 2A–2C illustrate a conventional method for reducing parasitic edge transistors by doping the corner and edge regions of the trench sidewalls. A trench 20 is etched from a substrate 50, as shown in FIG. 2A. Subsequently, in FIG. 2B, ions 14 are implanted into the corners and edges 25 of the trench 20 using a method known as angle implantation. FIG. 2C illustrates the trench 20 after the step of angle implantation has been completed.

A disadvantage of the conventional method described above and illustrated in FIGS. 2A–2C is that angle implantation becomes extremely difficult for deep, narrow trenches and for very narrow trenches (width≦0.5 $\mu$m) with a high aspect ratio (aspect ratio is defined as the ratio of the height of the trench to its width).

Figure 3A:
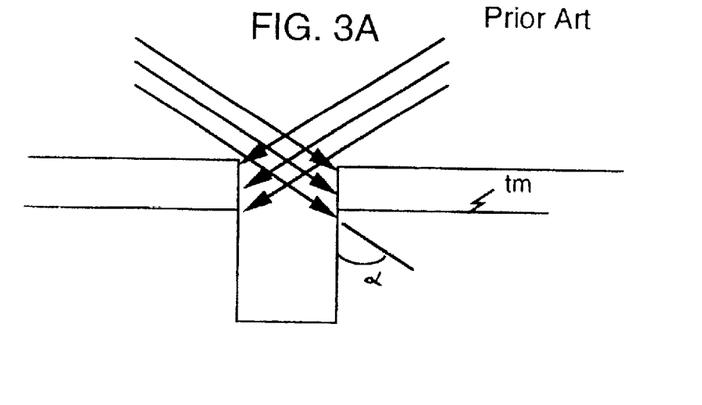
FIGS. 3A–3C show the relative difficulty of the conventional method of implanting ions into sidewalls of isolation trenches.
Figure 3B:
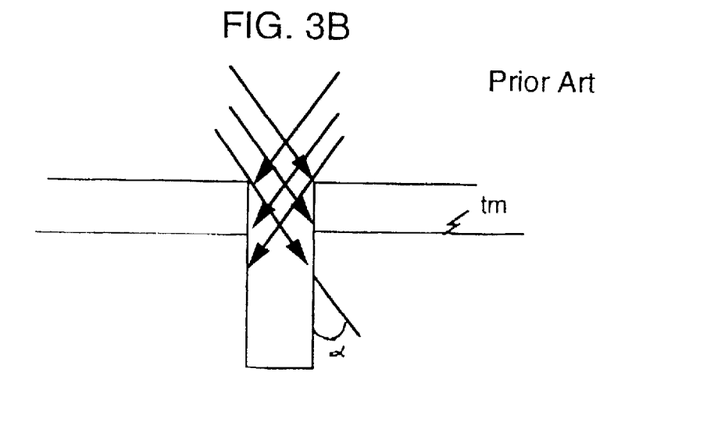
Figure 3C:
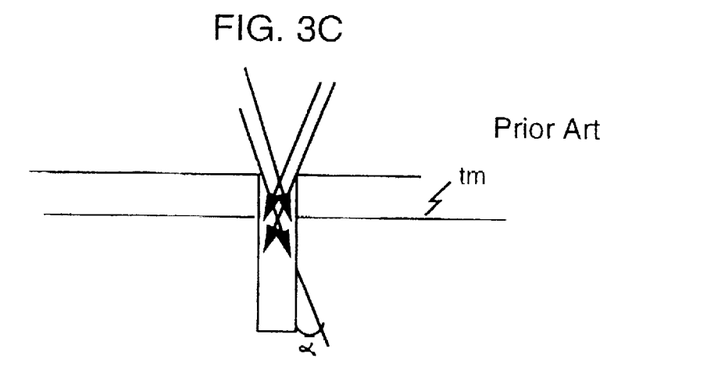

FIGS. 3A–3C illustrate the relative difficulty of implanting ions into trenches with higher aspect ratios. FIG. 3A illustrates the easiest of the three geometries for ion implantation. Ion implantation is more difficult with the geometry of FIG. 3B and the most difficult the geometry of FIG. 3C. It is well known that the difficulty of ion implantation is a function of the incidence angle α. The larger the incidence angle α, the easier the ion implantation.

In FIGS. 3A–3C, the incidence angle α is dependent on two independent variables—first, the width (or the aspect ratio) of the trenches and second, the thickness of the mask layer ($t_m$, which can be up to 1 $\mu$m). FIGS. 3B and 3C illustrate the effect of an increase in the thickness of the mask layer ($t_m$), known as a shadowing effect, on the incidence angle α.

Another disadvantage of the above-described conventional method is that the angle at which ion implantation is carried out needs to be adjusted in accordance with the trench width. Therefore, the wafer on which the IC devices are formed must be tilted so that a desired angle of incidence α is achieved with respect to one sidewall of the trench. Thereafter, the wafer must be rotated by 90°0 three times, so that each sidewall of the trench can be implanted at the same desired angle of incidence α.

SUMMARY OF THE INVENTION

It is an object of the invention to overcome the above and other problems of the conventional methods and apparatuses. Specifically, it is an object of the invention to provide an integrated circuit device which suppresses formation of the parasitic edge transistors at the corners of isolation trenches.

Another object of the invention is to reduce the electric field between the gate electrode and the substrate around the isolation trench corner.

Still another object of the invention is to shut off any parasitic edge transistor that may be formed at the corners of isolation trenches.

Yet another object of the invention is to eliminate the subthreshold kink in the I-V characteristic curve of an integrated circuit.

Still another object of the invention is to reduce the OFF current of the intrinsic transistor.

Yet another object of the invention is to improve the gate oxide quality for trench isolated technologies.

Still another object of the invention is to ease the sidewall angle implantation of the sidewalls of a trench by slanting the top corners of the trench.

The above and other objects of the invention are accomplished by a method of providing trench isolation on a silicon substrate. The method includes a step of forming a trench on a top surface of the silicon substrate, with the trench having two opposite facing side walls and a bottom wall. The method also includes a step of etching a top portion of each of the two opposite facing side walls to form a slanted surface thereon, wherein the slanted surface formed on the top portion of said each of the two opposite facing side walls reduces parasitic transistors around the trench.

The above-mentioned objects are also achieved by a trench formed on a silicon substrate and being part of a semiconductor device. The trench includes a bottom surface of the trench positioned substantially parallel to a top surface of the silicon substrate. The trench also includes first and second sidewalls positioned in a substantially parallel relationship with respect to each other and being in a substantially perpendicular angle with respect to the bottom surface of the trench and the top surface of the silicon substrate. The trench further includes a top portion of each of the first and second sidewalls being located adjacent to the top surface of the silicon substrate and having a first diagonal relationship with respect to a remainder portion of said of the first and second sidewalls and having a second diagonal relationship with respect to the top surface of the first and second sidewalls. The top portion provides a non-sharp surface of the trench, thereby reducing the parasitic transistors of the silicon substrate, and the top portion and the remainder portion of said each of the first and second sidewalls forms said respective first and second sidewalls in their entirety.

Additional objects and advantages of the invention will be set forth in the description which follows. The objects and advantages of the invention may be realized and obtained by means of the instrumentalities and combinations particularly pointed out in the appended claims.

BRIEF DESCRIPTION OF THE DRAWINGS

The invention is described in detail herein with reference to the drawings in which.

DETAILED DESCRIPTION OF THE PREFERRED EMBODIMENTS

The system and method according to the invention will be described in detail below, with reference to the accompanying figures. The invention provides an isolation scheme that alleviates the trench sharp corners at the top and bottom of the trench. This rounding of the trench corners and edges reduces the thinning of the gate oxide at the corners and edges of the trench, and thereby prevents oxide degradation. The invention also suppresses the "subthreshold kink" in the Id versus Vg (drain current versus gate voltage) curve of the transistor being formed on the substrate. This reduces the OFF current and results in a smaller subthreshold swing. Further, the parasitic transistors is reduced at the corners and edges of the trench.

Figure 4:
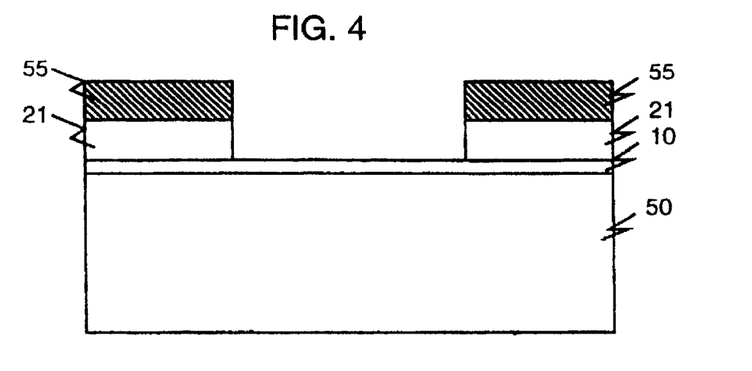
FIG. 4 shows the substrate after the silicon nitride has been etched in a step according to the method of the instant invention.

In a first step, field regions are defined by a mask after a pad oxide layer 10 of a certain thickness (100–250 angstroms in the preferred embodiment) is grown on a semiconductor substrate 50. After the pad oxide layer 10 is grown, a film is deposited with is selective to silicon etch, such as silicon nitride ($Si_3N_4$). In the preferred embodiment, the silicon nitride layer 21 is between 1350 and 1700 angstroms in depth. FIG. 4 shows the substrate 50 after the field regions have been defined by virtue of a photo resist mask 55 being used to etch off part of the silicon nitride layer 21. The pad oxide layer 10 remains intact over the entire substrate 50, due to the selective etching process in step 1.

In the next step, the silicon nitride is etched by a dry anisotropic etch.

Figure 5:
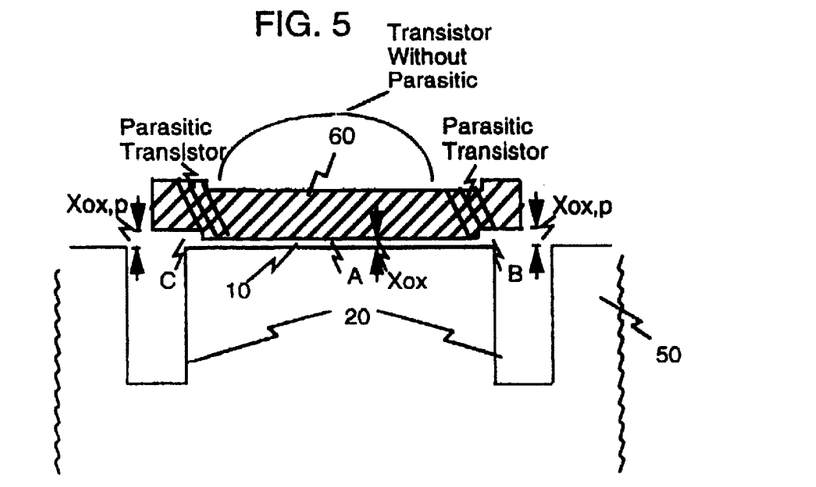
FIG. 5 shows the substrate with an enlarged gate oxide layer over the edges of the trenches, which happens as a result of the method of the instant invention.

In order to shut off the parasitic transistors formed at the top corners and edges of a trench, the threshold of the parasitic transistors need to be increased above the threshold of the actual transistor being formed on the substrate. This can be done by: a) increasing the oxide thickness at the corners of the trench, b) increasing the dopant concentration under the gate of the parasitic transistors (i.e., under points B and C as shown in FIG. 5), or c) performing both a) and b). Referring now to FIG. 5, points B and C, which correspond to the corners of the trench, have an oxide thickness of $X_{ox,p}$, which is greater than the gate oxide thickness $X_{ox}$ at other regions of the substrate 50 (such as point A under the poly layer 60 which forms the gate region). For a), we need the oxide thickness $X_{ox,p}$ to be greater or equal to the actual device gate oxide thickness $X_{ox}$; and for b), we need the channel concentration under $X_{ox,p}$ to be greater than or equal to the actual channel concentration under $X_{ox}$.

Figure 6:
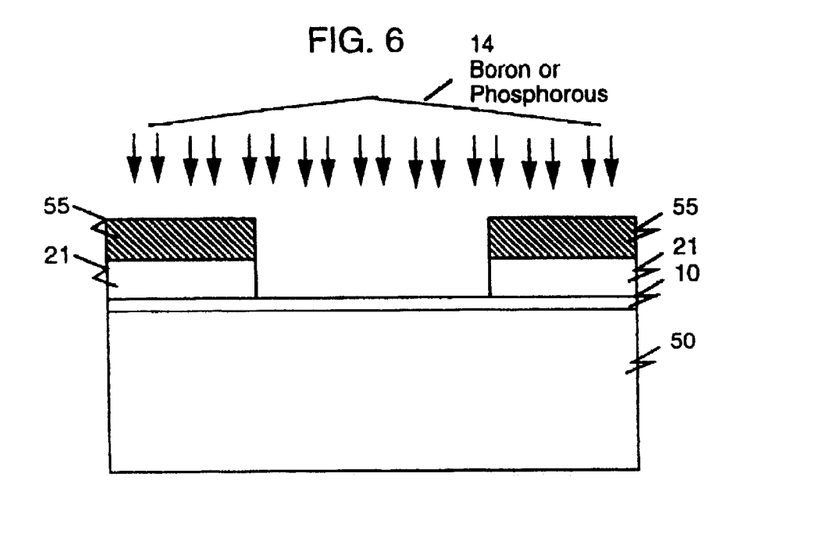
FIG. 6 shows the step of implanting boron onto the substrate in an alternative step according to the method of the instant invention.

The method as described in b), above, is a subject of U.S. Patent Application entitled "Method of Doping Trench Sidewalls Before Trench Etching", invented by Farrokh Omid-Zohoor, Attorney Docket Number 60048/145, AMD Docket Number B-270, which is assigned to AMD, Inc, and which is incorporated herein by reference. Briefly, this increased-dopant method is described below. In order to increase the threshold voltage (Vt) of the parasitic transistors, a step of implanting a p+ dopant 14, such as boron (B+ or $BF_2$), to the substrate is performed, as shown in FIG. 6. The implantation of a p+ dopant 14 is used for creating a p-type channel in order to form an n-type MOS (NMOS). Of course, if a p-type MOS (PMOS) is to be formed, this step would involve the implantation of an n+ dopant 14, such as arsenic or phosphorous, in order to form the n-type channel region for the PMOS.

Figure 7:
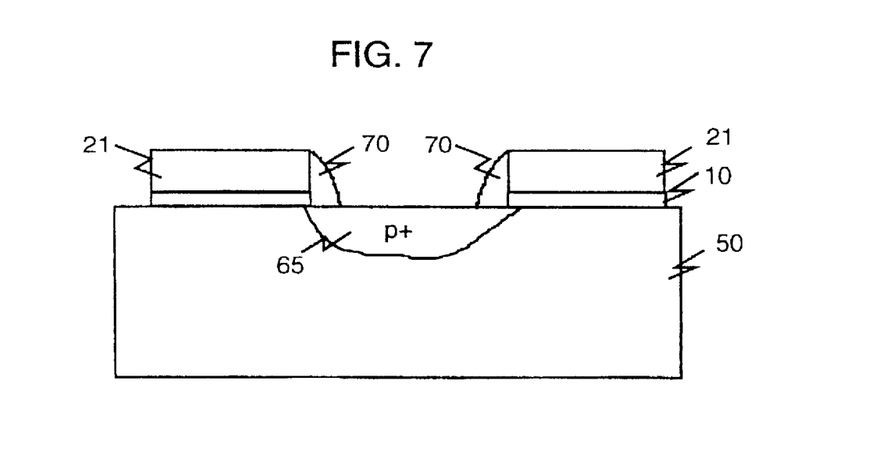
FIG. 7 shows the formation of oxide spacers in a step according to the method of the instant invention.

A next step involves removing the photoresist mask, and then an oxide (CVD) is deposited on the entire wafer. The next step involves a heat treatment (drive) to drive p+ dopant 65 laterally into the substrate 50. An oxide etch (anisotropic) is then performed to form an oxide spacer 70, as shown in FIG. 7. FIG. 7 also shows the p+ dopant 65 after it has driven laterally into the substrate 50.

Alternatively, the oxide spacer need not be formed, and instead the pad oxide layer 10 could be undercutted by about 200–300 angstroms. In this alternative method, the heat treatment to drive the dopant 65 laterally into the substrate 50 is performed before the undercutting of the pad oxide layer 10.

Figure 8:
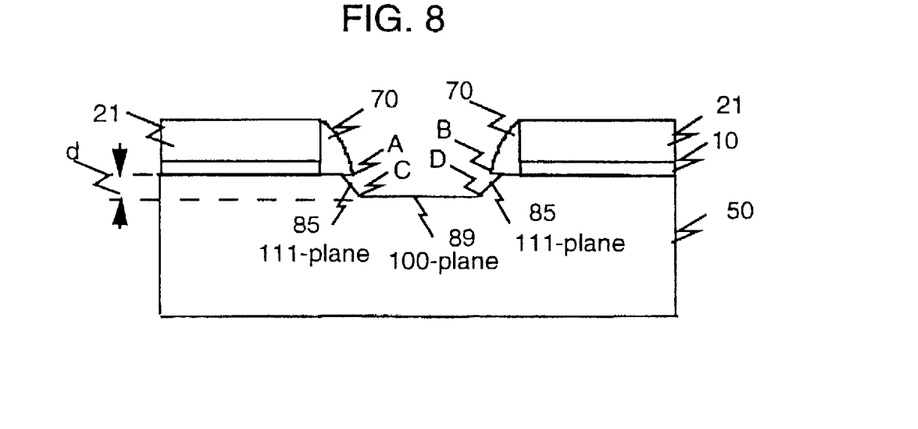
FIG. 8 shows the formation of the slanted top corners of the trench in a step according to the method of the instant invention.

Returning back to the process of the present invention, oxide spacers are formed on the substrate 50. A next step involves performing a selective wet silicon etch in order to etch the silicon anisotropically. The wet etchant can be either ($KOH+H_2O_2$) or ($NaOH+H_2O_2$), or chlorine hydroxide or pyrocatechol ethyl diamine. Only a small portion of the silicon substrate 50 between the oxide spacers 70 is etched during this step. These etchants act so as to etch (100) crystal planes (of silicon) much faster than (111) crystal planes, and the result of this etching step is shown in FIG. 8. The (111) crystal planes are shown as diagonally-etched regions 85, and the (100) crystal plane is shown as horizontally-etched region 89.

Depending on the amount of silicon etched (i.e., the depth "d"), the trench corners at the top or at the bottom can be rounded. This will be explained in more detail hereinbelow.

A next step involves performing a dry anisotropic etch to form a trench of a certain depth, such as between 0.4 and 0.7 microns. The resulting trench profile depends on the amount of wet silicon etch performed in the previous step.

Figure 9:
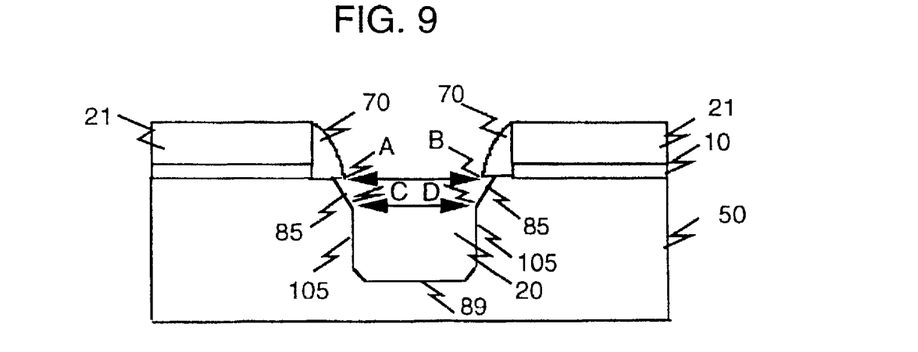
FIG. 9 shows the formation of the entire trench in a step according to the method of the instant invention.

The result of this step is a trench 20 having a structure as shown in FIG. 9, with a distance AB between the spacers 70 on the silicon substrate 50, and a distance CD between the sidewalls 105 of the trench 20. By virtue of this etch, the distance AB between the oxide spacers 70 will always be greater than or equal to the distance CD between the sidewalls 105 of the trench 20.

As a result of the etching performed in the previous steps, the middle part of the sidewalls 105 are of a 110-crystal plane structure, and the top and bottom of the sidewalls are of a 111-crystal plane structure, and the bottom surface 89 of the trench 20 is of a 100-crystal plane structure.

Note that the top and bottom portions of the sidewalls 105 actually exhibit a slanted shape, which will be rounded by later steps that will be described in more detail hereinbelow.

Up to this step, the top and bottom portions of the trench have been formed in a slanted shape. The trench corners have a 111-crystal plane structure, which makes these areas grow more oxide during a gate oxidation step. This ensures that the thickness of the gate oxide of the parasitic transistors are equal to or greater than the gate oxide thickness of the device (see FIG. 5).

Further, by increasing the dopant concentration in the vicinity of the slanted corners (a subject of a related patent application referred to earlier), the threshold voltage of the parasitic transistors is made greater than the device threshold voltage.

The isolation can be further improved and the parasitic transistors can be further lessened by the following steps.

The "slanted corners" are rounded by an oxidation cycle performed in a dry or steam ambient. This step can be performed either after the oxide spacers 70 are removed, or it can be performed with the oxide spacers 70 intact.

A next step involves etching the oxide spacers 70 off (if it had not already been etched off in prior to the previous step), and the oxidizing the trench 20.

Figure 10:
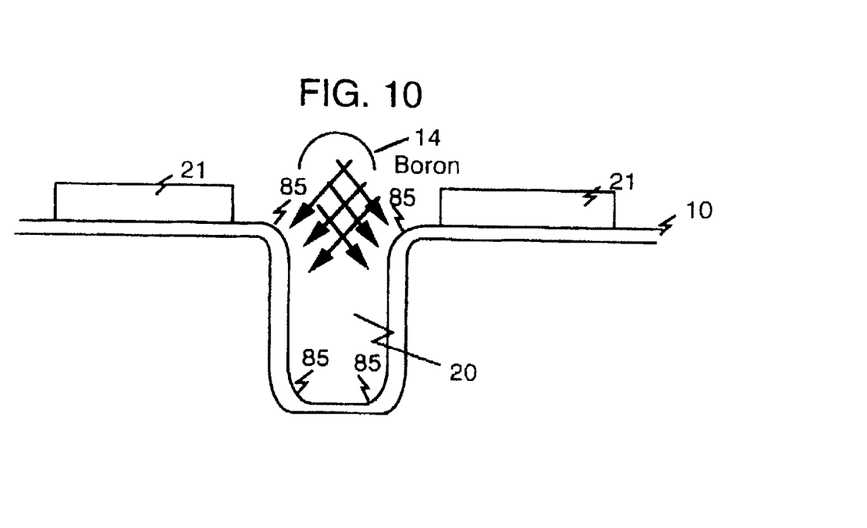
FIG. 10 shows the angle implantation into the slanted top and bottom corners of the trench according to the method of the instant invention.

A next step involves using a field mask and a side angle field implant to implant boron ($B^+$ or $BF_2$) into the slanted top corners 85 of the trench 20, as shown in FIG. 10. This step can be performed if the $B^+$ or $BF_2$ implant was not performed in an earlier step. To assure that the dopant concentration at the trench corners is high enough, the implanting and the angle implant are preferably performed during this step. FIG. 10 shows the effect of the oxidation step in rounding the top and bottom corners 85 of the trench 20.

The following steps describe trench filling and planarization, which are optional steps that may be performed after the rounding of the top and bottom corners 85 of the trench 20.

Figure 11:
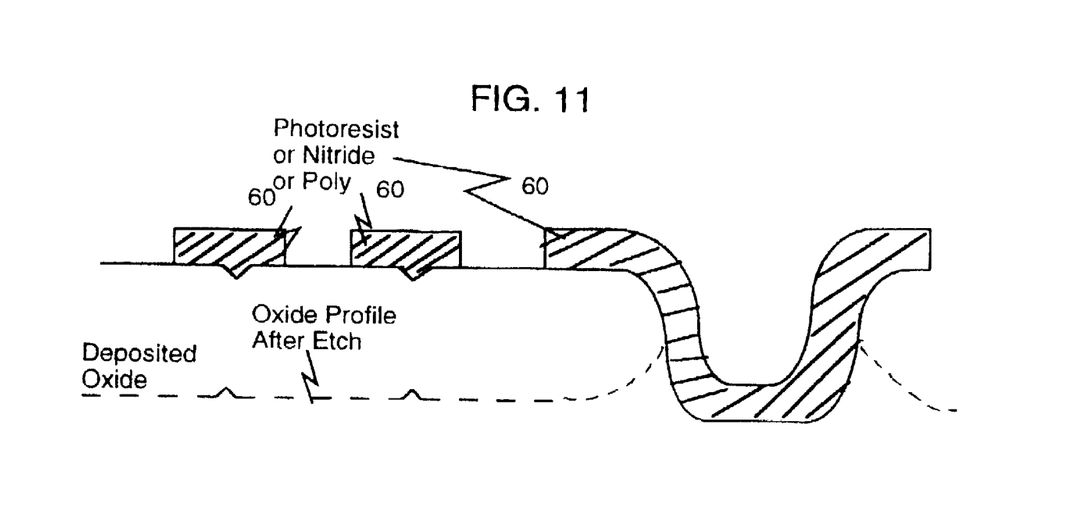
FIG. 11 shows the oxide profile during a planarization step according to the method of the instant invention.
Figure 12:
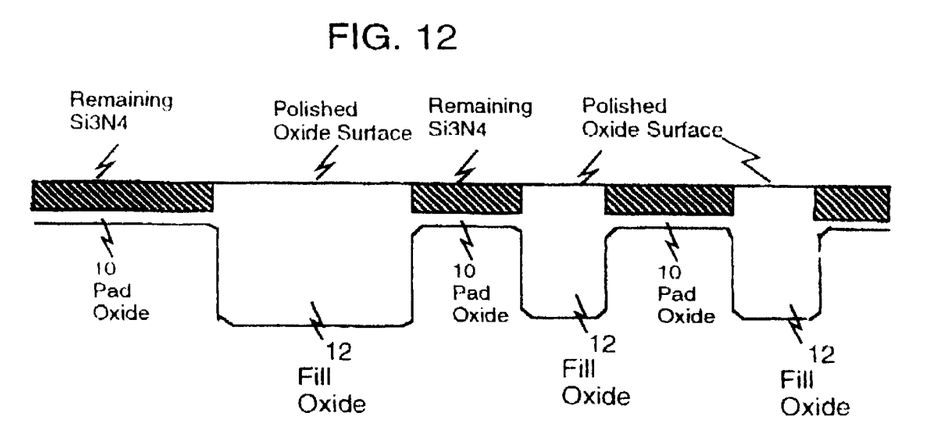
FIG. 12 shows the substrate after the polishing step according to the method of the instant invention.
Figure 13:
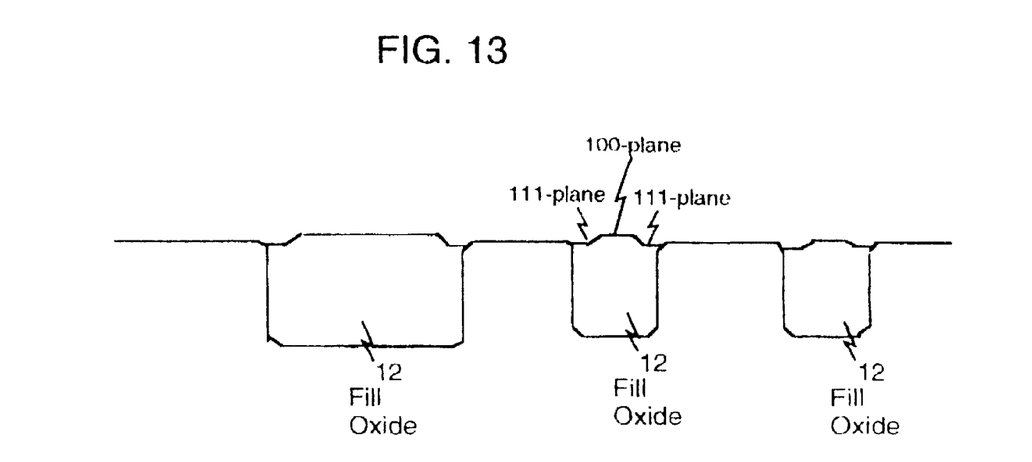
FIG. 13 shows the substrate before the gate oxidation step according to the method of the instant invention.

The planarization process starts by depositing a thick oxide onto the substrate 50. This is followed by a reverse photo resist mask, followed by a wet or dry oxide etch. FIG. 11 shows the substrate 50 with the oxide profile after the etch. A next step involves polishing the oxide ridges by CMP. The top surface of the oxide 12 in the trenches 20 is polished, and the nitride on top of the pad oxide 10 is left alone. A next step involves removing (etching) the nitride, and etching the pad oxide 10. A next step involves growing the gate oxide and depositing poly on the substrate 50. FIG. 12 shows the substrate 50 after the polishing step, and FIG. 13 shows the substrate 50 before the gate oxidation step. When the gate oxide is grown, referring now back to FIG. 5, the gate oxide layer 10 will grow faster over the 111-crystal plane regions at the edges of the trench 20 than it will grow over the 100-crystal plane regions over the middle portions of the trench 20. This creates the desired structure of having a thicker gate oxide layer at the edges of the trench 20, and together with the slanted or rounded trench edges 85, the parasitic transistors near the trench 20 are reduced to a great extent.

While particular embodiments according to the invention have been illustrated and described above, it will be clear to one of ordinary skill in the art that the invention can take a variety of forms and embodiments within the scope of the appended claims.

What is claimed is:

1. A trench formed on a silicon substrate and forming part of a semiconductor device, comprising:

a bottom surface of the trench positioned substantially parallel to a top surface of the silicon substrate;

first and second sidewalls positioned in a substantially parallel relationship with respect to each other and being in a substantially perpendicular angle with respect to the bottom surface of the trench and the top surface of the silicon substrate, a top portion of each of the first and second sidewalls being located adjacent to the top surface of the silicon substrate and having a first diagonal relationship with respect to a remainder portion of said of the first and second sidewalls and having a second diagonal relationship with respect to the top surface of the first and second sidewalls, wherein the top portion provides a non-sharp surface of the trench, thereby reducing the parasitic transistors of the silicon substrate, and wherein the top portion and the remainder portion of said each of the first and second sidewalls forms said respective first and second sidewalls in their entirety.

2. A trench according to claim 1, further comprising:

a first oxide layer filling said trench up to the top surface of the silicon substrate; and a second oxide layer located on the top surface of the silicon substrate and acting as a pad oxide layer, wherein the second oxide layer has a larger depth at regions directly above the first and second sidewalls than at other regions of the silicon substrate.

3. A method of providing isolation by a vertical trench in a silicon substrate, comprising the steps:

a) forming opposing spacers on the silicon substrate, the distance between the spacers defining the opening for the vertical trench;

b) forming an opening at a top surface of the silicon substrate, the opening having two opposite facing side walls with slanted surfaces thereon and a bottom wall;

c) anisotropically etching the silicon substrate as defined by spacers to complete the remainder of the trench with vertical side walls;

d) forming a gate oxidation layer on the silicon substrate including the slanted surface and vertical side walls of the trench;

wherein the gate oxidation layer has a greater thickness over the slanted surface at the top of the trench than on other areas of the silicon substrate.

4. A method according to claim 3, wherein the trench forms part of a transistor being formed on the silicon substrate, and wherein the thicker gate oxidation layer over the slanted surface results in an increased threshold voltage of parasitic transistors on the silicon substrate that are adjacent to the transistor being formed.

5. A method of improving angle implantation for a trench on a silicon substrate, comprising the steps of:

a) forming said trench on a top surface of the silicon substrate, the trench having two opposite facing side walls and a bottom wall;

b) etching a top portion of each of the two opposite facing side walls to form a slanted surface thereon; and c) performing an angle implantation of a dopant into the trench so as to form a doped trench, wherein the slanted surface on the opposite facing sidewalls allows for an increased area for the angle implantation of the dopant into the trench.

6. A method according to claim 5, further comprising the step of forming a gate oxidation layer on top of the doped trench.

7. In a method of forming a vertical trench in a silicon substrate for isolation of adjacent transistors having a gate oxide, said method comprising the steps of:

forming an opening on the surface of the silicon substrate;

forming spacers in said opening, said spacers defining the vertical portion of the to-be-formed trench;

etching the silicon substrate in said opening with an isotropic etchant which etches the (100) crystal plane of silicon faster than the (111) crystal plane so as to form angular surfaces in and at the top of the substrate and under the silicon spacers;

anisotropically etching the opening defined by the spacers to form the trench having vertical side walls;

removing the spacers;

forming an oxide layer on the exposed portions of the silicon substrate at the opening including the areas of the removed spacers, the angular surfaces and the vertical side walls; and forming gate oxide for the adjacent transistors;

wherein the oxide thickness on the slanted surfaces is greater than the gate oxide.

8. The method of claim 7 wherein impurity ions are implanted into said angular surfaces of the silicon substrate at an angle of about perpendicular to the angular surfaces.

* * * * *